United States Patent [19]
Russell et al.

[11] Patent Number: 5,310,990
[45] Date of Patent: May 10, 1994

[54] METHOD OF LASER PROCESSING FERROELECTRIC MATERIALS

[75] Inventors: Stephen D. Russell; Douglas A. Sexton, both of San Diego, Calif.

[73] Assignee: The United Stated of America as represented by the Secretary of the Navy, Washington, D.C.

[21] Appl. No.: 709,671

[22] Filed: Jun. 3, 1991

[51] Int. Cl.$^5$ .......................................... B23K 26/12
[52] U.S. Cl. .......................................... 219/121.69
[58] Field of Search ............... 219/121.61, 121.68, 219/121.69, 121.86, 121.67, 121.75, 121.6; 437/52, 235, 247; 427/42, 53.1, 554–559, 126.3; 156/643, 345; 148/DIG. 90, DIG. 93, 1.5; 361/321; 118/50.1; 359/624

[56] References Cited

U.S. PATENT DOCUMENTS

| | | | |
|---|---|---|---|
| 4,114,018 | 9/1978 | Von Allmen et al. | 219/121.69 |
| 4,275,288 | 6/1981 | Makosch et al. | 219/121.75 |
| 4,305,640 | 12/1981 | Cullis et al. | 219/121.6 |
| 4,316,074 | 2/1982 | Daly | 219/121.6 |
| 4,370,175 | 1/1983 | Levatter | 219/121.6 |
| 4,427,723 | 1/1984 | Swain | 437/247 |
| 4,437,139 | 3/1984 | Howard | 148/1.5 |
| 4,475,027 | 10/1984 | Pressley | 219/121.6 |
| 4,508,749 | 4/1985 | Brannon et al. | 427/53.1 |
| 4,668,304 | 5/1987 | Schachameyer et al. | 148/DIG. 93 |
| 4,733,944 | 3/1988 | Fahlen et al. | 359/624 |
| 4,752,668 | 6/1988 | Rosenfield et al. | 219/121.68 |
| 4,786,358 | 11/1988 | Yamazaki et al. | 427/53.1 |
| 4,793,694 | 12/1988 | Liu | 219/121.75 |
| 4,874,920 | 10/1989 | Yamazaki et al. | 427/53.1 |
| 4,882,200 | 11/1989 | Liu et al. | 427/555 |
| 4,932,747 | 6/1990 | Russell et al. | 219/121.61 |
| 4,946,710 | 8/1990 | Miller et al. | 427/126.3 |
| 4,963,390 | 10/1990 | Lipeles et al. | 427/126.3 |
| 5,068,515 | 11/1991 | van den Bergh et al. | 219/121.75 |
| 5,094,977 | 3/1992 | Yu et al. | 148/DIG. 93 |
| 5,106,211 | 4/1992 | Chiang et al. | 219/121.6 |
| 5,119,760 | 5/1992 | McMillan et al. | 118/50.1 |
| 5,132,248 | 7/1992 | Drummond et al. | 427/555 |
| 5,145,713 | 9/1992 | Venkateson et al. | 427/53.1 |
| 5,155,658 | 10/1992 | Inam et al. | 361/321 |
| 5,164,324 | 11/1992 | Russell et al. | 437/19 |
| 5,188,902 | 2/1993 | Lin | 428/426 |

OTHER PUBLICATIONS

Cole, B. C., Finally, It's Ferroelectric, Electronics, Aug. 1989, 88–89.

Baker, S. Ferroelectric Chips, VLSI Systems Design, May 1988, 116–123.

Pollack, A. Advances: Silicon Chips Are Promising a New Era for Computers, New York Times, Mar. 23, 1988.

Eaton, S. S., Butler, D. B., Parris, M., Wilson, D., & McNellie, H. A Ferroelectric Memory, International Solid State Circuits Conference, Reprint of paper THAM 10.6, No Publication Date.

Ferroelectric Radiation–Hardness for Nonvolatile Memory Applications, Krysalis Corporation Technical Report No. 08005, Nov. 1987.

(List continued on next page.)

*Primary Examiner*—Geoffrey S. Evans
*Attorney, Agent, or Firm*—Harvey Fendelman; Thomas Glenn Keough

[57] ABSTRACT

Processing methods transform ferroelectric precursor films into a desired crystalline structure without adversely heating nearby materials and circuitry such as those found associated with lead zirconate titanate films. The thin film sample is placed within an appropriate chamber, where a suitable ambient is in contact with the thin film sample. The ambient may be air, oxygen or any other ambient which is known in the art to be appropriate for annealing ferroelectric materials. In this regard annealing in air can done without the processing chamber. The process for annealing relies upon continuous wave (CW) laser annealing, pulse UV annealing with or without a laser and various combinations of thermal pretreatment and processing to allow solid state diffusion in accordance with parameters appropriate for a particular application. Methods of laser patterning thin film ferroelectrics without adversely damaging adjacent or underlying layers, e.g. electrodes, are also disclosed.

13 Claims, 3 Drawing Sheets

OTHER PUBLICATIONS

Kulkarni, A., Rohrer, G., Narayan, S., & McMillan, L. Electrical Properties of Ferroelectric Thin Film $KNO_3$ Memory Devices, Thin Solid Films, vol. 264, 1988, 339–343.

Dey, S. K., Budd, K. D., & Payne, D. A. Thin Film Ferroelectrics by Sol–Gel Processing, IEEE Trans. UFFC, vol. 35, Jan. 1988, 80–81.

Yi, G., Wu, Z., & Sayer, M. Preparation of Pb $(Zr,Ti)O_3$ Thin Films by Sogel Processing–Electrical, Optical and Electro–Optic Properties, J. Appl. Phys, vol. 64, 2717, May 1988.

Abrahams, S. C., & Keve, E. T. Structural Basis of Ferroelectricity and Ferroelasticity, Ferroelectrics, vol. 2, 1971, 129–154.

Kawaguchi, T., et al. PLZT Thin–Film Waveguides, Applied Optics, vol. 23, No. 13, Jul. 1, 1984, 2187–2191.

Houle, F. A. Basic Mechanisms in Laser Etching & Depositions, Appl Phys, A 41, Jul. 1986, 315–330.

Armacost, M. D., et al. 193–nm Excimer Laser–Assisted Etching of Polysilicon, Mat. Res. Soc. Symp. Proc. vol. 76, 1987.

Horiike, Y., et al. Excimer–Laser Etching on Silicon, Appl. Phys. A 44, 313–332, Aug. 1987.

Carey, P. G., et al. Fabrication of Submicrometer MOSFET's Using Gas Immersion Lased Doping (GILD), IEEE Electron Device Letters, vol. EDL–7, No. 7, Jul. 1986.

Ableson, J. R., et al. Epitaxial $Ge_xSi_{1-x}$/Si(100) Structures Produced by Pulsed Laser Mixing of Evaporated Ge on Si(100) Substrates, Appl. Phys. Lett. vol. 52, No. 3, Jan. 18, 1988.

Rothchild, M., et al. Visible–Lased Etching of Refractory Metals by Surface Modification, J. Vac. Sci. Technol. B vol. 5, No. 5, Sep./Oct. 1987.

Pini, R., et al., Optical Fiber Transmission of High Power Excimer Laser Radiation, Applied Optics, vol. 26, No. 19, Oct. 1987.

Gutmann, V., ed., Halogen Chemistry, vol. 2, 1967, pp. 173–189.

Winters, H. F., Coburn, J. W., & Chuang, T. J., Surface Processes in Plasma–Assisted Etching Environments, J. Vac. Sci. Technol. B, vol. 1, 1983, 469.

Heath, B. A., & Kammerdiner, L., Plasma Processing for VLSI, Chap. 27 in Einspruch, N. G., ed., VLSL Handbook, 1985, pp. 487–502.

Osgood, R. M., Jr., Sanchez–Rubio, A., Ehrlich, D. J., & Daneu, V. Localized Laser Etching of Compound Semiconductors in Aqueous Solution, Appl. Phys. Lett., vol. 40, Mar. 1982, 391.

von Gutfeld, R. J., & Hodgson, R. T. Laser–enhanced Etching in KOH, Appl. Phys. Lett., vol. 40, 1982, 352.

Bunkin, F. V., Luk'yanchuk, B. S., & Shafeev, G. A. Laser Control over Elecgrochemical Processes, SPIE, vol. 473 Symp. OPTIKA, 1984, pp. 31–37.

Brunauer, S., Emmett, P. H., & Teller, E. Adsorption of Gases in Multimolecular Layers, J. Am. Chem. Soc., vol. 60, 1938, 309.

Gauthier, R., & Guittard, C. Mechanism Investigations of a Pulsed Laser Light Induced Desorption, Phys. Stat. Sol. (A), vol. 38, 1976, 447.

Ehrlich, D., & Tsao, J. A Review of Laser–Microchemical Processing, J. Vac. Sci. Technol. B, vol. 1, 969, Aug. 1983.

Bauerle, D. Chemical Processing with Lasers: Recent Developments, Appl. Phys B, vol. 46, 1988, 261.

Chuang, T. J. Laser–induced Chemical Etching of Solids: Promises and Challenges, In Laser Controlled Chemical Processing of Surfaces, Materials Research Society Symposia Proceedings, vol. 29, pp. 185–194, 1988.

Kullmer, R., & Bauerle, D. Laser–induced Chemical Etching of Silicon in Chlorine Atmosphere: I. Pulsed Irradiation, Appl. Phys., A, vol. 43, 227, Mar. 1987.

Mogyorosi, P., Piglmayer, K., Kullmer, R., & Bauerle, D. Laser–induced Chemical Etching of Silicon in Chlorine Atmosphere: II. Continuous Irradiation, vol. 45, 1988, 293.

Kullmer, R., & Bauerle, D. Laser–induced Chemical Etching of Silicon in Chlorine Atmosphere: III. Combined CW and Pulsed Irradiation, vol. 47, 1988, 377.

Palmer, S., & Orvek, K. Laser–induced Etching of Silicon at 248 nm by $F_2$/Ne, Conference on Lasers and Electro–Optics Technical Digest Series 1988, vol. 7, 1988, 284.

Brannon, J. H. Chemical Etching of Silicon by $CO_2$–Laser–induced Dissociation of $NF_3$, Appl. Phys. A, vol. 46, 1988, 39.

Chuang, T. J. Infrared Laser Radiation Effects on $XeF_2$ Interaction with Silicon, J. Chem. Phys., vol. 74, Jan. 1981, 1461.

Houle, F. A. Photoeffects on the Fluorination of Silicon: I. Influence of Doping on Steady–state Phenomena, J. Chem. Phys., vol. 79, 1983, 4237.

(List continued on next page.)

OTHER PUBLICATIONS

Houle, F. A. Photoeffects on the Fluorination of Silicon: II. Kinetics of the Initial Response to Light, J. Chem. Phys., vol. 80, 1984, 4851.

Chuang, T. J. Multiple Photon Excited $SF_6$ Interaction with Silicon Surfaces, J. Chem. Phys., vol. 74, 1981, 1453.

Armacost, M. D., Babu, S. V., Nguyen, S. V., & Rembetski, J. F. 193 nm Excimer Laser-assisted Etching of Polysilicon, Mat. Res. Soc. Symp. Proc. vol. 76, 1987, pp. 147-156.

Ehrlich, D. J., et al. Laser-induced Micorscopic Etching of GaAs and InP, Appl. Phys. Lett., vol. 36, No. 8, Apr. 15, 1980.

Brewer, P., et al. Photon-assisted Dry Etching of GaAs, Appl. Phys. Lett., vol. 45, No. 4, Aug. 1984, 15.

Rytz-Froidevaux, Y., et al. Laser Generated Microstructures, Appl. Phys., A, vol. 37, 1985, 121-138.

Janesick, J. R., et al. Flash Technology for Charge-coupled-device Imaging in the Ultraviolet, Optical Engineering, vol. 26, 1987, 852-863.

Bell, A. E. Review and Analysis of Laser Annealing, RCA Review, vol. 40, Sep. 1979, 295-338.

Weiner, K. H., et al. Thin-base Bipolar Transistor Fabrication Using Gas Immersion Laser Doping, IEEE Electron Dev. Lett., vol. 10, 1989, 260-263.

Russell, S. D., et al. Bipolar Transistors in Silicon-on-sapphire (SOS): Effects of Nanosecond Thermal Processing, IEEE SOS/SOI Technology Conference Proceedings, 1990.

Tassin, C., et al. Thinned Backside Illuminated CCDs for Ultraviolet Imaging, Ultraviolet Technology II, SPIE, vol. 932, 1988, 305-310.

Stern, R. A., et al. Ultraviolet and Extreme Ultraviolet Response of Charge-coupled-device Detectors, Optical Engineering, vol. 26, Sep. 1987, 875-883.

Singer, P. H., ed. Laser Planarized Metal Shows Several Advantages, Semiconductor International, vol. 13, No. 6, May 1990, 18, 20.

Kaminsky, G. Micromachining of Silicon Mechanical Structures, J. Vac. Sci. Technol. B., vol. 3, No. 4, Jul.-/Aug. 1985, 1015-1024.

Russell, S. D., & Sexton, D. A. Excimer Laser-assisted Etching of Silicon Using Chlorapentafluoroethane, In Rosenberg, R., Bernhardt, A. F., & Black, J. G. (eds), In-Situ Patterning: Selective Area Deposition and Etching, (Mat. Res. Soc. Proc., vol. 158), 1990, pp. 325-330.

Sesselmann, W., & Chuang, T. J. Chlorine Surface Interaction and Laser-induced Surface Etching Reactions, J. Vac. Sci, Technol. B, vol. 3, 1985, 1507.

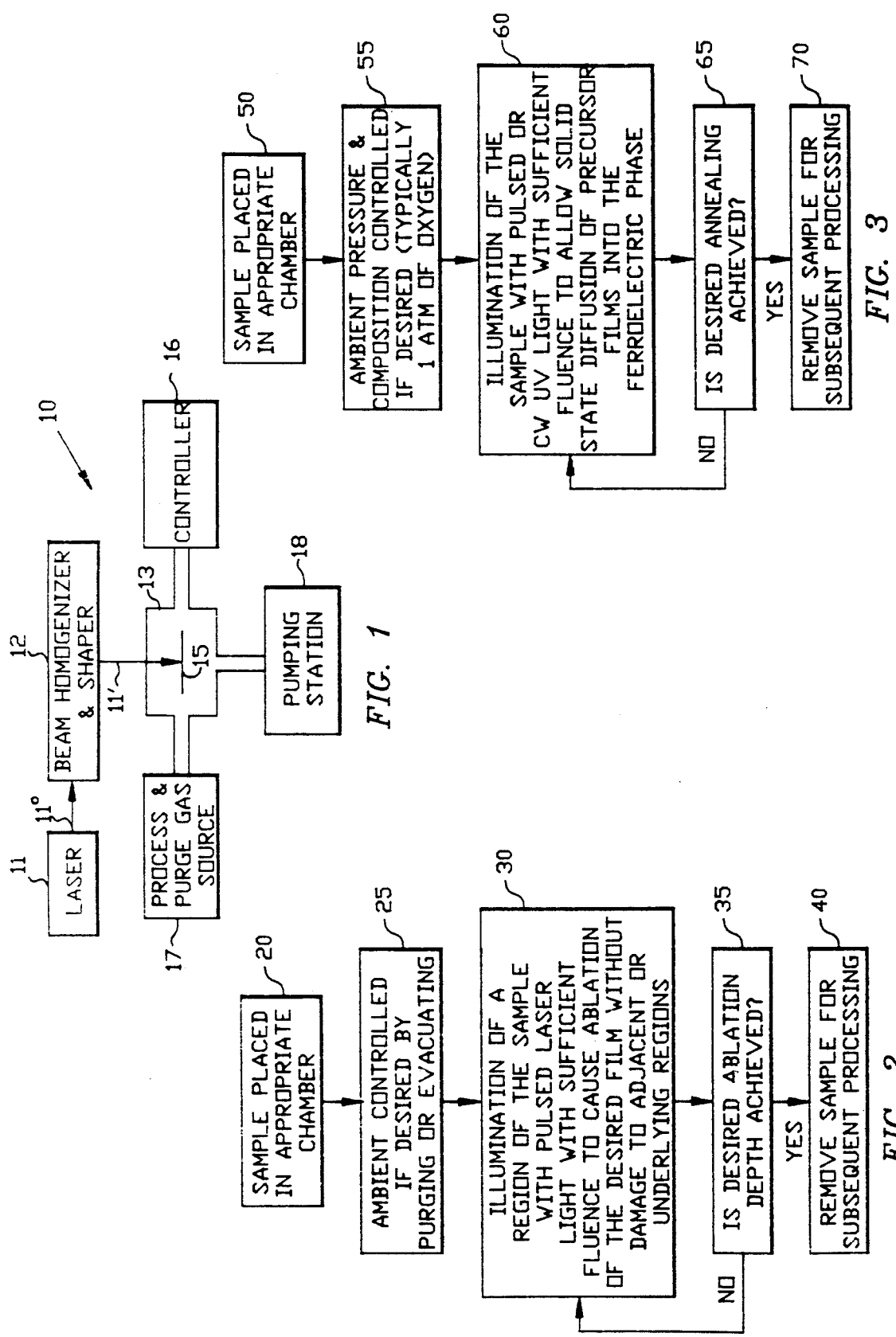

METHOD OF LASER PROCESSING FERROELECTRIC MATERIALS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This invention relates to U.S. Patent application Ser. No. 07/501,707 (NC 71,978) filed Mar. 28, 1990 by S. D. Russell et al. entitled "Method for Laser-Assisted Silicon Etching Using Halocarbon Ambients"; U.S. Patent application Ser. No. 07/508,317 (NC 72,726) filed Apr. 9, 1990 by S. D. Russell et al. entitled "Method for Laser-Assisted Etching of III-V and II-VI Semiconductor Compounds Using Chlorofluorocarbon Ambients"; U.S. Patent application Ser. No. 07/591,930 (NC 72,219) filed Sep. 30, 1990 by D. A. Sexton et al. entitled "Excimer Laser Dopant Activation of Backside Illuminated CCDs"; and U.S. Patent application Ser. No. 07,589,839 (NC 73,014) filed Sep. 25, 1990 by S. C. Russel et al. entitled "Laser Texturing", now U.S. Pat. No. 5,164,324.

BACKGROUND OF THE INVENTION

Ferroelectric materials have been examined for applications as a non-volatile and radiation hard memory compatible with silicon-based semiconductor processing and for integrated electro-optics. Ridge-type channel waveguides have been fabricated using ion-beam etching techniques on thin film lanthanum-modified-lead-zirconate-titanate (PLZT) as reported in the paper by T. Kawaguchi et al. in their article, "PLZT Thin-Film Waveguides," Appl. Optics, Vol. 23, 1984, pp. 2187-2191. Ion beam etching is necessary for patterning since there is no suitable conventional etchant for PLZT films, and high temperature processes can result in out-diffusion of the lead (Pb) from the thin film. Ion beam etching techniques have a number of limitations however; (1) etching selectivity between the thin film and the photoresist mask is poor (typically 1.2:1), (2) etch rates are low (typically 13 nm/min), (3) typical etch nonuniformities are large (10%), and (4) there is limited control of the resulting surface quality. These limitations inhibit low cost, high yield fabrication of integrated devices and also effect device performance. Patterning thin ferroelectric films is also of interest for novel electronic device structures. Representative examples of ferroelectric materials which have been examined for electronic applications are by: B. C. Cole, in the article "Finally, It's Ferroelectric," Electronics, August 1989, pp. 88-89, S. Baker, in the article "Ferroelectric Chips," VLSI Systems Design, May 1988, pp. 116-123, A. Pollack, in the article "Advances: Silicon Chips Are Promising a New Era for Computers," New York Times, Mar. 23, 1988, S. S. Eaton et al. in their article, "A Ferroelectric Memory," International Solid State Circuits Conference, reprint of paper THAM 10.6, in the article "Ferroelectric Radiation-Hardness for Nonvolatile Memory Applications," Krysalis Corporation Technical Report No. 08005, November 1987 and by A. Kulkarni et al. in their article, "Electrical Properties of Ferroelectric Thin Film $KNO_3$ Memory Devices," Thin Solid Films, Vol. 264, 1988, pp. 339-343.

Thin film forms of ferroelectrics are particularly compatible with the layered processing structure inherent in conventional semiconductor processing. The formation of the thin film ferroelectric material lead zirconate titanate (PZT) has been previously reported by S. K. Dey et al. in , K. D. Budd, & D. A. Payne, "Thin Film Ferroelectrics by Sol-Gel Processing," IEEE Trans. UFFC, Vol. 35, Jan. 1988, pp. 80-81 and G. Yi et al. in, "Preparation of Pb $(Zr,Ti)O_3$ Thin Films by Sol-Gel Processing-Electrical, Optical and Electro-Optic Properties," J. Appl. Phys, Vol. 64, 1988, p. 2717. This is fabricated by the combination of appropriate solvents to form a "sol-gel" solution, and spun-on a wafer using conventional photoresist spinning techniques. The sol-gel thin film is then heated at a low temperature to volatilize the solvents leaving the appropriate stoichiometry in a ferroelectric precursor thin film form. The polycrystalline precursor film must then be annealed to transform the material into the perovskite crystal structure which exhibits the characteristic electric dipole character within the unit cell and associated ferroelectric properties, see S. C. Abrahams et al.'s, "Structural Basis of Ferroelectricity and Ferroelasticity," Ferroelectrics, Vol. 2, 1971, pp. 129-154. Conventional furnace annealing in either air or an oxygen ambient at temperatures between about 500° to 600° C. for tens of minutes to an hour is satisfactory to achieve this transformation. This key step is however not compatible with CMOS circuitry used for memory chips.

As discussed in the above referenced Sexton et al.'s U.S. Patent application No. 07/591,930 entitled "Excimer Laser Dopant Activation of Backside Illuminated CCDs", high temperature processing (greater than about 400° C.) will damage prior metallization, and may cause unwanted diffusion resulting in shifts in transistor characteristics or catastrophic device damage. As in the case for annealing silicon to activate dopant atoms in backside illuminated CCDs, annealing ferroelectric films using conventional processes will damage the previously fabricated circuitry. Therefore, successful integration of ferroelectric thin films, such as PZT, into semiconductor processing will require a low temperature annealing process. Similarly, low temperature patterning of the PZT films in non-corrosive ambients will provide for novel device structures previously unobtainable.

Thus, there is a continuing need in the state of the art for a low temperature laser patterning method using the same apparatus as disclosed in the above referenced patent applications, with appropriate process modifications required for ferroelectric materials and an annealing method which does not cause destruction of the highly volatile components of the film to transform ferroelectric films into a desired crystalline structure and to effect a patterning thereon without the adverse heating effects on nearby materials and circuitry.

SUMMARY OF THE INVENTION

The present invention is directed to providing a method of laser processing ferroelectric materials calling for placing a thin film sample within a suitable ambient and annealing or patterning the thin film sample in the suitable ambient by continuous wave (CW) laser illumination, pulse UV illumination with or without a laser in conjunction with various types of sample pretreatment and processing to allow solid state diffusion in the case of annealing or ablation in the case of patterning. It is also to be understood that the term "ferroelectric materials" refers to the related forms, crystallographic phases and associated properties, such as, ferroelectric precursor films, piezoelectric, paraelectric, ferroelastic, etc. as the teachings herein are appropriate.

An object of the invention is to provide an improved method of processing ferroelectric materials.

An object of the invention is to provide an improved method of patterning ferroelectric materials.

An object of the invention is to provide an improved method of annealing ferroelectric materials.

Another object is to provide a laser processing of ferroelectric materials in which a thin film sample is placed within a suitable ambient and annealing or patterning of the thin film sample in the suitable ambient is performed by continuous wave (CW) laser illumination, pulse UV illumination with or without a laser in conjunction with various types of sample pre-treatment and processing to allow solid state diffusion in the case of annealing or ablation in the case of patterning.

Another object is to provide an improved method of processing ferroelectric materials relying on laser processing.

Another object is to provide for the laser processing of ferroelectric materials providing for spatially localized noncontact processing.

Another object of the invention is to provide for the laser processing of ferroelectric materials providing for the isolated laser processing thereof.

Another object is to provide for laser processing of ferroelectric materials providing for a low average temperature thereby to allow integration with microelectronic devices.

Another object of the invention is to provide for the laser patterning of ferroelectric materials employing a noncontact method to remove thin ferroelectric films without damaging underlying thin films (such as electrodes) or other nearby circuitry.

Yet another object is to provide a laser patterning of ferroelectric materials relying on a non-contact method to remove ferroelectric films without damaging underlying thin films (electrodes and circuitry) within predetermined processing windows for these materials.

Still another object is to provide for the laser processing of ferroelectric materials assuring a low temperature annealing of the ferroelectric films.

Still another object is to provide for the laser processing of ferroelectric materials allowing for changes in the ambient, changes in substrate temperatures, and for thermal pretreatment of the samples and light source (continuous wave or pulse) to be employed within selective ranges.

Yet another object is to provide for the laser processing of ferroelectric materials which allows for variations in film composition and thicknesses to accommodate modifications to satisfactorily pattern and anneal the desired surfaces.

Still another object is to provide for a laser processing of ferroelectric materials capable of accommodating other ceramic materials such as high temperature superconductors which require annealing in an oxygenated ambient.

These and other objects of the invention will become more readily apparent from the ensuing specification and drawings when taken in conjunction with the appended claims.

BRIEF DESCRIPTION OF THE DRAWINGS

FIG. 1 depicts a representative apparatus for administering the method of laser processing of ferroelectric materials in accordance with this inventive concept.

FIG. 2 sets forth the procedure for laser patterning ferroelectric materials in accordance with this inventive concept.

FIG. 3 depicts the procedure for annealing ferroelectric materials in accordance with this inventive concept.

DESCRIPTION OF THE PREFERRED EMBODIMENT

Figure 4:
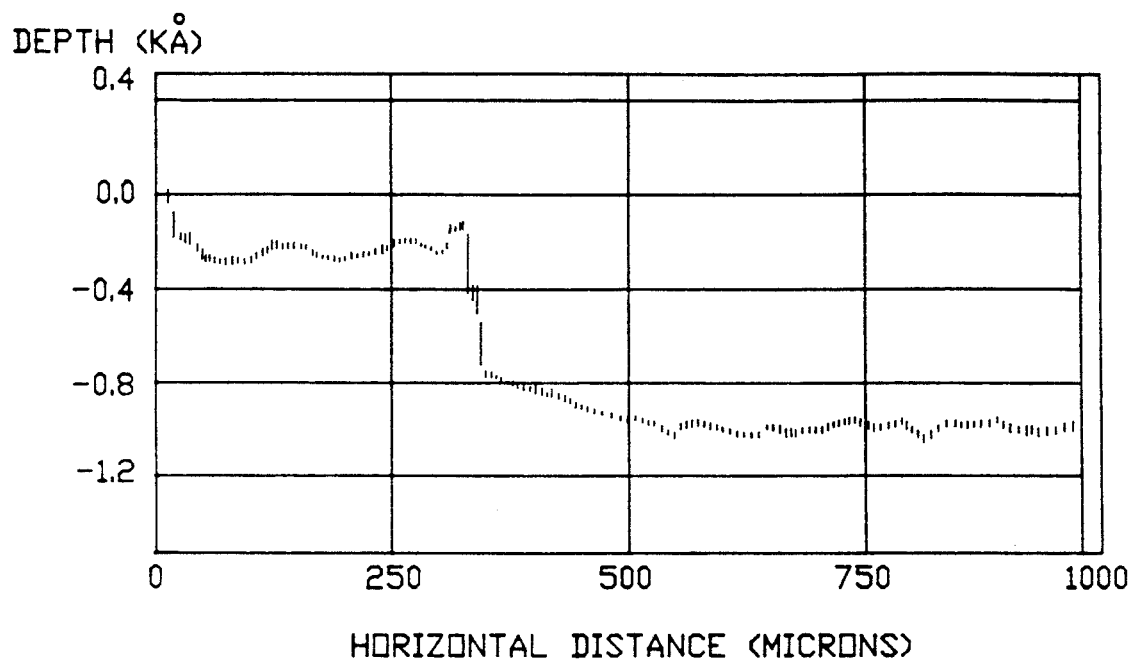
FIG. 4 depicts densification associated with laser annealing of ferroelectric materials in accordance with this inventive concept.

Referring now to FIG. 1 of the drawings, a representative processor 10 for patterning and annealing in accordance with the teachings of this inventive concept is disclosed herein which is fabricated in substantially the same manner as that referred to in detail in the above identified co-pending application No. 07/591,930 entitled "Excimer Laser Dopant Activation of Backside Illuminated CCD's." Processor 10 includes an excimer laser 11 that emits its output beam $11^0$ into a beam homogenizer and shaper 12. Excimer lasers operated in accordance with this inventive concept have pulse durations of at least 10 nsec. and when applied within the scope of the teachings of this invention, this pulse length may be varied. The beam homogenizer and shaper can be such as that disclosed by Stephen D. Russell et al. in U.S. Pat. No. 4,932,747 which homogenizes the intensity profile of beam $11^0$ to have a substantially flat response beam 11' across an area that covers all or a selected region of a thin film sample 15. The beam homogenizer and shaper are suitable tailored and oriented to assure that an appropriately homogenized and shaped beam 11' for the particularly shaped and compositioned sample is directed appropriately into a processing chamber 13 and onto thin film sample 15 for processing.

A gas mass flow controller 16 controls the flow and pressurization of processing and purging gases from a process and purge gas source 17 in processing chamber 13 so that the processing of the sample can be accomplished in accordance with the method disclosed hereinafter. A pumping station 18 is coupled to the processing chamber to evacuate the chamber and remove byproducts of the processing operation.

A full description of these constituents for effecting the method of laser processing ferroelectric materials is elaborated on in the above referenced co-pending inventions and will make readily apparent an appreciation of the salient features of this inventive concept to those skilled in the art.

Here it is to be noted that the term "ferroelectric materials", as used in the context of this inventive concept, is intended to refer to the related forms, crystallographic phases and associated properties, such as, ferroelectric precursor films, piezoelectric, paraelectric, ferroelastic, etc..

One important aspect of the method of laser processing ferroelectric materials calls for placing a thin film sample within a suitable ambient and annealing or patterning the thin film sample in the suitable ambient by continuous wave (CW) laser illumination, pulse UV illumination with or without a laser in conjunction with various types of sample pre-treatment and processing to allow solid state diffusion in the case of annealing or ablation in the case of patterning.

Another important aspect in the laser patterning of ferroelectric materials is providing a laser intensity profile which has a well-defined edge in order to achieve high resolution patterning of sample 15 and prevent nonuniform segregation or ablation of elements at the boundary of the laser profile. Well-defined in this context means that the variation in intensity between a central intensity portion used for processing and an outer intensity portion is large. The outer intensity portion must be of insufficient fluence to damage the sample. This variation is provided for in the selected and referenced beam homogenizer, for example, although other alternatives will suggest themselves.

The procedure for laser patterning a sample 15 of ferroelectric materials is shown in FIG. 2, with reference to FIG. 1. Thin film sample 15 is placed 20 within a processing chamber 13, or, in the case of using air in the process of this inventive concept, the term processing chamber is intended to embrace the atmosphere in which ambient air is contained. The ambient is controlled 25 by contacting the sample 15 in a suitable ambient or in the flow of an ambient from a source 17 and/or evacuation by a pump 18 may be used to remove ablative by-products in a manner that is standard in the art. Note that processing in an air ambient can proceed without the processing chamber, but illumination 30 with a uniform laser beam intensity with a well-defined boundary is required for high resolution patterning in an air ambient.

The homogenized, shaped and uniform beam 11' of the excimer laser is directed onto the surface of the thin film ferroelectric material sample 15 (illumination 30) for one or more pulses depending on the critical parameters: pulse energy, pulse length, repetition rate, absorbed fluence (energy/area), wavelength, film thickness, composition, substrate temperature and composition, and ambient conditions. A portion of the laser energy is absorbed by the sample (fraction absorbed depends on composition, wavelength and incident angle) thereby heating the sample above the ablation threshold to thereby result in the vaporizing of the material.

Laser patterning of ferroelectric materials typically are performed with laser beam 11' at normal incidence to sample 15 with the sample being maintained at room temperature. Due to the strong absorption of 248 nm UV light by PZT, illumination 30 by beam 11' from laser 11 with even low fluences (greater than about 150 mJ/cm$^2$ on about a 25 nanosecond time scale, typical for excimer lasers) results in volatilization and partial ablation of the ferroelectric precursor film. Furthermore, damage to underlying electrode layers with low reflectivity at this wavelength occur with fluences greater than, about 500 mJ/cm$^2$.

Therefore, a crucial factor which must be considered is film thickness since too great a fluence for a given thickness may damage the underlying electrodes in certain device structures of interest, e. g. capacitors. Illumination 30 by beam 11' from laser 11 with excimer laser light of 351 nm (closer to the absorption edge for PZT) has been found to allow removal of 300 nm thick PZT film without damage to the underlying electrode with fluences between about 20 to 500 mJ/cm$^2$ (laser pulse duration about 25 nsec). An inspection 35 by appropriate optics or suitable instrumentation (not shown) will reveal if the desired patterning has been effected in the thin film sample and an operator performs a removal 40 of the patterned sample 15.

If further patterning is needed, one or more additional illuminations 30 are initiated until the desired pattern is formed and noted by an additional inspection 35. Next, an operator effects a removal 40 of the now appropriately patterned sample 15 from the ambient (in chamber 13 for specific ambients other than air at atmospheric pressure) so that further processing can follow.

Looking to FIG. 3, the procedure for annealing ferroelectric materials is shown in consideration with FIG. 1. Thin film sample 15 is placed 50 within chamber 13, where a suitable ambient is controlled 55 to be in contact with sample 15. This ambient may be air, oxygen, or any other ambient which is appropriate for annealing ferroelectric materials which is known in the art. Here again it is to be noted that annealing in air is done without the processing chamber.

The process for annealing can be any of the following: illumination 60 by continuous wave (CW) laser annealing, pulsed UV annealing with or without a laser, and various combinations of sample pre-treatment and processing. As in the case for excimer laser processing in general, optically-based annealing of the thin film ferroelectric material has the following critical parameters: pulse energy, pulse length, repetition rate, number of pulses, absorbed fluence (energy/area), wavelength, film thickness, composition, substrate temperature and composition, and ambient conditions. For CW illumination, duration of exposure, scan speeds and exposure area are appropriately substituted. A portion of the light energy is absorbed by the sample (fraction absorbed depends on composition, wavelength and incident angle) thereby heating the sample resulting in solid state diffusion into the appropriate ferroelectric crystal structure.

Laser annealing of ferroelectric materials typically is performed with the laser beam 11' at normal incidence to sample 15 with the sample placed in chamber 13 in an atmosphere of oxygen at 1 atmosphere of pressure, and sample 15 at room temperature. Due to the strong absorption of 248 nm UV light by PZT, illumination 60 with even low fluences below about 200 mJ/cm$^2$ on about a 25 nanosecond time scale) results in volatilization and partial ablation of the ferroelectric precursor film and, although appropriate for patterning, is destructive for annealing applications. Even illumination 60 with 351 nm light (XeF excimer laser) near the band edge (as described above) may result in ablation of the precursor ferroelectric film of sample 15.

The tens of nanoseconds pulse duration of typical excimer lasers for laser 11 produces extremely high peak power (even at low pulse energies) so that annealing without ablating of conventionally prepared precursed films (200°-300° C. thermal pretreatment) is not possible with the sample at room temperature. Adding a constant temperature to the sample (below which any integrated circuitry is damaged), and using an excimer laser to locally heat the sample may be employed to anneal the film.

Although the preceding has concerned itself with laser processing of ferroelectric materials typically performed with the laser beam at normal incidence to the sample with the sample placed in an atmosphere of oxygen at 1 atmosphere of pressure, and the sample at room temperature, excimer laser irradiation of sol-gel precursor films on sample 15 produces volatilization of the solvents if sufficient thermal pretreatment is not performed. For conventional furnace annealing it is sufficient to preheat the precursor film of sample 15 to about 200°-300° C. This is not sufficient for laser processing since volatilization of the solvents results in ablation of the precursor film and sometimes the underlying materials during nanosecond laser processing. Preheating at 412° C. for one hour has shown partial densification of the precursor film into a partially annealed state and volatilizing the solvents thereby increasing the ablation threshold of the films and opening a laser annealing processing window by varying the laser fluence. A lower temperature preheating treatment at 230° C. under vacuum for two hours offers the same laser processing window, while eliminating any oxidation of underlying electrodes which can provide significant processing hurdles. Thermal pretreatment can be above 100° C. in vacuum for duration for at least one hour or thermal pretreatment can be above 300° C. for duration for at least one hour in a gaseous ambient.

Figure 5:
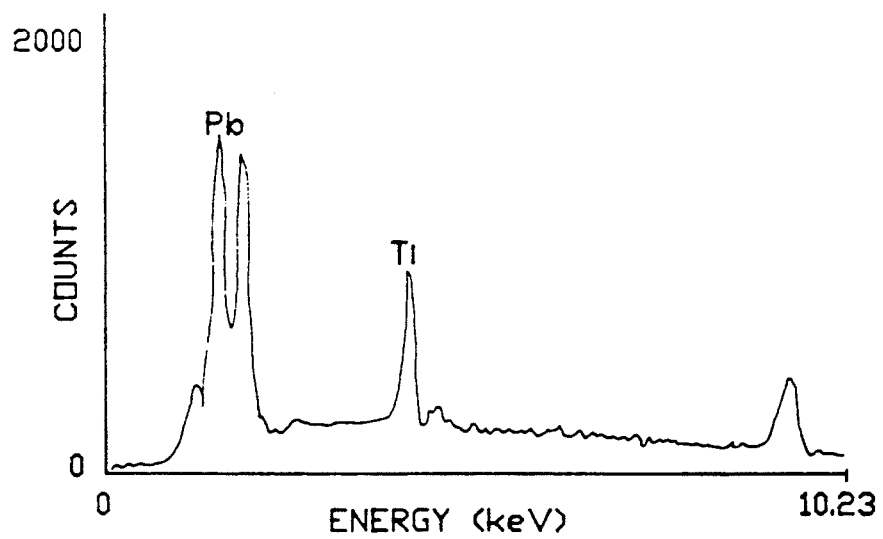
FIG. 5 depicts the energy dispersive X-ray spectrum of a conventionally annealed ferroelectric film.
Figure 6:
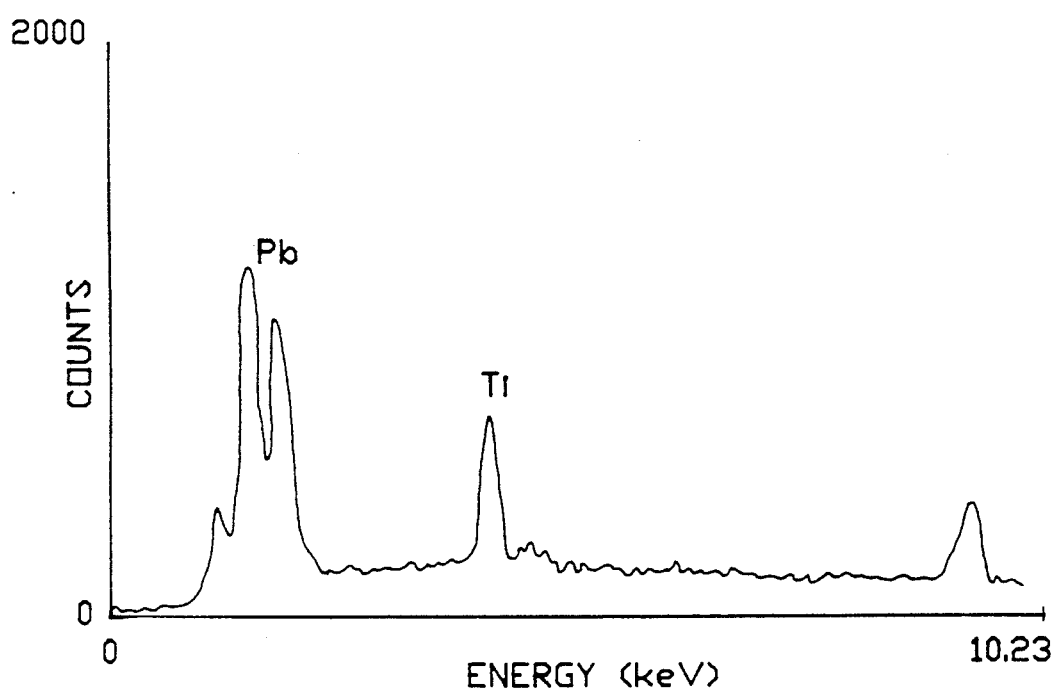
FIG. 6 depicts the energy dispersive X-ray spectrum of a laser annealed ferroelectric film.
Figure 7:
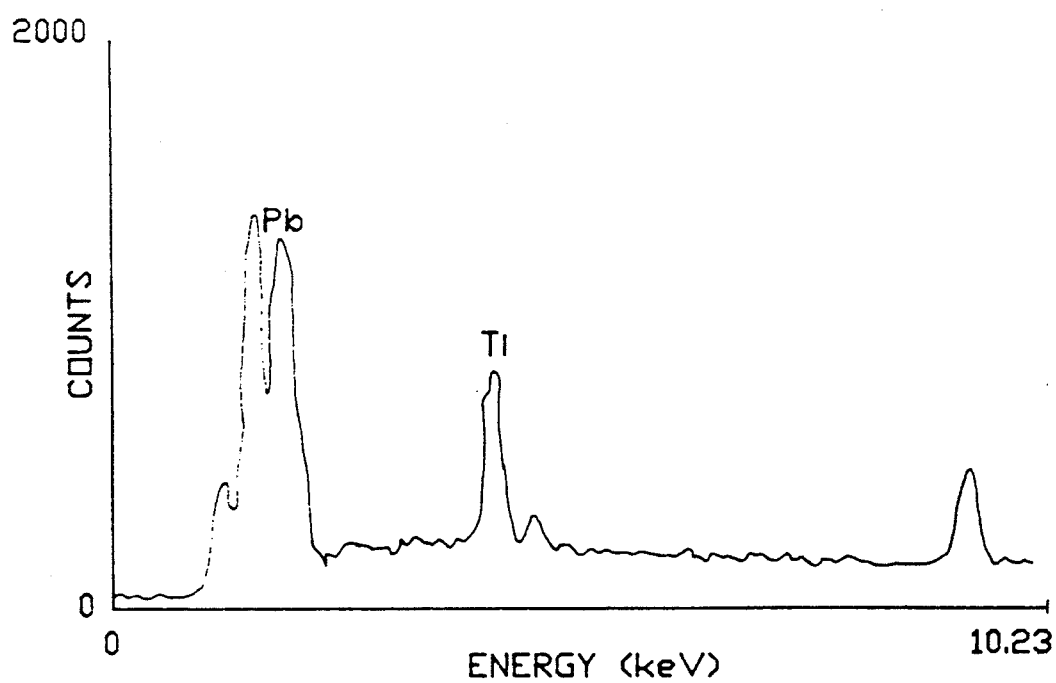
FIG. 7 depicts the energy dispersive X-ray spectrum of an unannealed ferroelectric precursor film.

Using laser fluences that are above the ablation threshold of conventional thermally pre-treated precursor films (about 0.85–1.1 J/cm$^2$), illumination 60 of 351 nm light at 10 Hz (for at least 10 minutes) shows annealing of the higher temperature preheated or vacuum heated films into the ferroelectric state. Signatures of this annealing include: densification of the laser irradiated area, color change in the film, and correct lead (Pb) stoichiometry. FIG. 4 shows a stylus profilometer trace depicting densification of the thin film ferroelectric in the laser annealed region. FIG. 5 shows the energy dispersive X-ray spectrum of a conventional furnace annealed ferroelectric film. FIG. 6 shows an energy dispersive X-ray spectrum of the laser annealed thin film ferroelectric showing nonvolatilization of the lead (Pb) or titanium (Ti) in the film thereby exhibiting nondestruction of the stoichiometry within detection limits. FIG. 7 shows the energy dispersive X-ray spectrum of an unannealed prescurser film with desired stoichiometry consistent with both the laser and furnace annealed samples. These signatures are obtained in the laser annealed samples with sufficient thermal pretreatment.

Using these properly thermal pretreated films, processing windows for other wavelengths are created. Generally, pulse laser fluences between 500 to 1500 mJ/cm$^2$ with pulse durations greater than 10 nsec are suitable for annealing. The low fluences needed for this annealing enables large area processing, for example by projection of illumination 60 through a mask, for rapid processing of entire wafers. The low temperature and rapid processing time prevents oxidation of underlying electrodes thereby eliminating other processing difficulties. [For example, oxidation of Ti in the underlying electrodes during conventional annealing in oxygen forms TiO (rutile) which is extremely resistant to chemical processing, preventing the easy and rapid patterning required for semiconductor device processing.]

CW annealing using an argon ion or He-Cd laser operating in the UV has the benefits of shallow absorption, spatial localization and low temperature offered by the excimer laser without the detrimental effects of very high peak power. Pulsed illumination on millisecond time scales, such as by a flashlamp or by rapid thermal annealing, will produce UV light with similar desirable properties without the high peak powers of the excimer enabling annealing of the films. The latter technique lacks the spatial control since the entire wafer is heated, but in general can be considered as a low temperature process.

In addition to variations in the above mentioned critical parameters, changes in ambient, substrate temperature, thermal pretreatment of samples, and light source (continuous wave or pulsed) may be employed with the ranges discussed above. Variations in film composition and thickness may require modifications to the above method which will be obvious in view of the above teachings. Similarly, other ceramic materials such as high temperature superconductors, which require annealing in an oxygenated ambient may be laser annealed using appropriate modifications to these teachings.

Obviously, many modifications and variations of the present invention are possible in the light of the above teachings. It is therefore to be understood that within the scope of the appended claims, the invention may be practiced otherwise than as specifically described.

We claim:

1. A method of laser patterning a region of a thin film ferroelectric material comprising:
   placing said thin film ferroelectric material in an appropriate processing chamber;
   contacting said region of said thin film ferroelectric material with a suitable ambient;
   providing a beam of UV laser light having a substantially flat homogenized-intensity-profile response that is shaped to cover said region; and
   illuminating said region of said thin film ferroelectric material in said suitable ambient with said beam of UV laser light having a substantially flat homogenized-intensity-profile response that is shaped to cover said region with the proper amount of fluence to cause substantial uniform ablation of said region of said thin film ferroelectric material to create said laser patterning without damage to adjacent or underlying materials.

2. A method of laser patterning according to claim 1 in which the step of illuminating is repeated to effect a desired depth of ablation and said patterning in said thin film ferroelectric material.

3. A method of laser patterning according to claim 1 or 2 in which said laser light is pulsed in the UV region of the electromagnetic spectrum.

4. A method of laser patterning according to claim 3 in which said fluence is between about 20 mJ/cm$^2$ and 500 mJ/cm$^2$ with pulse durations exceeding 10 nsec..

5. A method of laser patterning according to claim 4 in which the pulsed laser light is at the XeF wavelength of 351 nm.

6. A method of laser annealing a region of a thin film ferroelectric precursor to form a thin film ferroelectric material comprising:
   placing said thin film ferroelectric precursor in an appropriate processing chamber;
   contacting said thin film ferroelectric precursor with a suitable ambient;
   preheating said region of said thin film ferroelectric precursor to provide a thermal pretreatment to prevent volatilization and ablation thereof;

providing a beam of UV laser light having a substantially flat homogenized-intensity-profile response that is shaped to cover said region; and illuminating said region of said thin film ferroelectric precursor in said suitable ambient with said beam of UV laser light having a substantially flat homogenized-intensity-profile response that is shaped to cover said region with sufficient fluence to allow solid state diffusion of said precursor into the ferroelectric phase to effect said annealing of said region of said precursor to form said thin film ferroelectric material without damage to adjacent or underlying materials, in which said pretreatment being above 100° C. in vacuum for duration for at least one hour.

7. A method of laser annealing a region of a thin film ferroelectric precursor to form a thin film ferroelectric material comprising:

placing said thin film ferroelectric precursor in an appropriate processing chamber;

contacting said thin film ferroelectric precursor with a suitable ambient;

preheating said region of said thin film ferroelectric precursor to provide a thermal pretreatment to prevent volatilization and ablation thereof;

providing a beam of UV laser light having a substantially flat homogenized-intensity-profile response that is shaped to cover said region; and illuminating said region of said thin film ferroelectric precursor in said suitable ambient with said beam of UV laser light having a substantially flat homogenized-intensity-profile response that is shaped to cover said region with sufficient fluence to allow solid state diffusion of said precursor into the ferroelectric phase to effect said annealing of said region of said precursor to form said thin film ferroelectric material without damage to adjacent or underlying materials, in which the step of illuminating with UV laser light being repeated to effect a desired depth of annealing in said thin film ferroelectric precursor and in which said pretreatment being above 100° C. in vacuum for duration for at least one hour.

8. A method of laser annealing a region of a thin film ferroelectric precursor to form a thin film ferroelectric material comprising:

placing said thin film ferroelectric precursor in an appropriate processing chamber;

contacting said thin film ferroelectric precursor with a suitable ambient;

preheating said region of said thin film ferroelectric precursor to provide a thermal pretreatment to prevent volatilization and ablation thereof;

providing a beam of UV laser light having a substantially flat homogenized-intensity-profile response that is shaped to cover said region; and illuminating said region of said thin film ferroelectric precursor in said suitable ambient with said beam of UV laser light having a substantially flat homogenized-intensity-profile response that is shaped to cover said region with sufficient fluence to allow solid state diffusion of said precursor into the ferroelectric phase to effect said annealing of said region of said precursor to form said thin film ferroelectric material without damage to adjacent or underlying materials, in which said thermal pretreatment being above 300° C. for duration for at least one hour in a gaseous ambient.

9. A method of laser annealing a region of a thin film ferroelectric precursor to form a thin film ferroelectric material comprising:

placing said thin film ferroelectric precursor in an appropriate processing chamber;

contacting said thin film ferroelectric precursor with a suitable ambient;

preheating said region of said thin film ferroelectric precursor to provide a thermal pretreatment to prevent volatilization and ablation thereof;

providing a beam of UV laser light having a substantially flat homogenized-intensity-profile response that is shaped to cover said region; and illuminating said region of said thin film ferroelectric precursor in said suitable ambient with said beam of UV laser light having a substantially flat homogenized-intensity-profile response that is shaped to cover said region with sufficient fluence to allow solid state diffusion of said precursor into the ferroelectric phase to effect said annealing of said region of said precursor to form said thin film ferroelectric material without damage to adjacent or underlying materials, in which the step of illuminating with UV laser light being repeated to effect a desired depth of annealing in said thin film ferroelectric precursor and in which said thermal pretreatment being above 300° C. for duration for at least one hour in a gaseous ambient.

10. A method of laser annealing a region of a thin film ferroelectric sol-gel precursor to form a thin film ferroelectric material comprising:

placing said thin film ferroelectric sol-gel precursor in an appropriate processing chamber;

contacting said thin film ferroelectric sol-gel precursor with a suitable ambient;

preheating said region of said thin film ferroelectric sol-gel precursor to provide a thermal pretreatment to prevent volatilization and ablation of said sol-gel precursor;

providing a beam of UV laser light having a substantially flat homogenized-intensity-profile response that is shaped to cover said region; and illuminating said region of said thin film ferroelectric sol-gel precursor in said suitable ambient with said beam of UV laser light having a substantially flat homogenized-intensity-profile response that is shaped to cover said region with sufficient fluence to densify said thin film ferroelectric sol-gel precursor and allow solid state diffusion of said sol-gel precursor into the ferroelectric phase to effect said annealing of said region of said sol-gel precursor to form said thin film ferroelectric material without damage to adjacent or underlying materials, in which said thermal pretreatment being above 100° C. in vacuum for duration for at least one hour.

11. A method of laser annealing a region of a thin film ferroelectric sol-gel precursor to form a thin film ferroelectric material comprising:

placing said thin film ferroelectric sol-gel precursor in an appropriate processing chamber;

contacting said thin film ferroelectric sol-gel precursor with a suitable ambient;

preheating said region of said thin film ferroelectric sol-gel precursor to provide a thermal pretreatment to prevent volatilization and ablation of said sol-gel precursor;

providing a beam of UV laser light having a substantially flat homogenized-intensity-profile response that is shaped to cover said region; and illuminating said region of said thin film ferroelectric sol-gel precursor in said suitable ambient with said beam of UV laser light having a substantially flat homogenized-intensity-profile response that is shaped to cover said region with sufficient fluence to densify said thin film ferroelectric sol-gel precursor and allow solid state diffusion of said sol-gel precursor into the ferroelectric phase to effect said annealing of said region of said sol-gel precursor to form said thin film ferroelectric material without damage to adjacent or underlying materials, in which said thermal pretreatment being above 100° C. in vacuum for duration for at least one hour.

12. A method of laser annealing a region of a thin film ferroelectric sol-gel precursor to form a thin film ferroelectric material comprising:

placing said thin film ferroelectric sol-gel precursor in an appropriate processing chamber;

contacting said thin film ferroelectric sol-gel precursor with a suitable ambient;

preheating said region of said thin film ferroelectric sol-gel precursor to provide a thermal pretreatment to prevent volatilization and ablation of said sol-gel precursor;

providing a beam of UV laser light having a substantially flat homogenized-intensity-profile response that is shaped to cover said region; and illuminating said region of said thin film ferroelectric sol-gel precursor in said suitable ambient with said beam of UV laser light having a substantially flat homogenized-intensity-profile response that is shaped to cover said region with sufficient fluence to densify said thin film ferroelectric sol-gel precursor and allow solid state diffusion of said sol-gel precursor into the ferroelectric phase to effect said annealing of said region of said sol-gel precursor to form said thin film ferroelectric material without damage to adjacent or underlying materials, in which said thermal pretreatment being above 300° C. for duration for at least one hour in a gaseous ambient.

13. A method of laser annealing a region of a thin film ferroelectric sol-gel precursor to form a thin film ferroelectric material comprising:

placing said thin film ferroelectric sol-gel precursor in an appropriate processing chamber;

contacting said thin film ferroelectric sol-gel precursor with a suitable ambient;

preheating said region of said thin film ferroelectric sol-gel precursor to provide a thermal pretreatment to prevent volatilization and ablation of said sol-gel precursor;

providing a beam of UV laser light having a substantially flat homogenized-intensity-profile response that is shaped to cover said region; and illuminating said region of said thin film ferroelectric sol-gel precursor in said suitable ambient with said beam of UV laser light having a substantially flat homogenized-intensity-profile response that is shaped to cover said region with sufficient fluence to densify said thin film ferroelectric sol-gel precursor and allow solid state diffusion of said sol-gel precursor into the ferroelectric phase to effect said annealing of said region of said sol-gel precursor to form said thin film ferroelectric material without damage to adjacent or underlying materials, in which the step of illuminating with pulsed laser light is repeated to effect a desired depth of annealing in said thin film ferroelectric said sol-gel precursor and in which said thermal pretreatment being above 300° C. for duration for at least one hour in a gaseous ambient.

* * * * *